United States Patent
Horng et al.

(10) Patent No.: US 7,663,131 B2
(45) Date of Patent: Feb. 16, 2010

(54) SYAF STRUCTURE TO FABRICATE MBIT MTJ MRAM

(75) Inventors: Cheng T. Horng, San Jose, CA (US);
Ru-Ying Tong, Los Gatos, CA (US);
Chyu-Jiuh Torng, Pleasanton, CA (US);
Guangli Liu, Fremont, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 405 days.

(21) Appl. No.: 11/715,728

(22) Filed: Mar. 8, 2007

(65) Prior Publication Data
US 2008/0217710 A1 Sep. 11, 2008

(51) Int. Cl.
*H01L 47/00* (2006.01)
(52) U.S. Cl. .................... 257/2; 257/295; 257/421; 257/422; 257/425
(58) Field of Classification Search .............. 257/2, 257/295, 421, 422, 425
See application file for complete search history.

(56) References Cited

U.S. PATENT DOCUMENTS

| | | | |
|---|---|---|---|
| 6,818,458 B1 * | 11/2004 | Gill | 438/3 |
| 7,045,841 B2 | 5/2006 | Hong et al. | |
| 7,067,331 B2 | 6/2006 | Slaughter et al. | |
| 2005/0276099 A1 | 12/2005 | Horng et al. | |
| 2006/0017081 A1 | 1/2006 | Sun et al. | |
| 2006/0211198 A1 | 9/2006 | Horng et al. | |
| 2007/0015293 A1 | 1/2007 | Wang et al. | |
| 2007/0015294 A1 | 1/2007 | Horng et al. | |

OTHER PUBLICATIONS

Co-pending U.S. Patent HMG-06-011/12, U.S. Appl. No. 11/496,691, filed Jul. 31, 2006, Assigned to the same assignee, "A Novel Capping Layer for a Magnetic Tunnel Junction Device to Enhance dR/R and a Method of Making the Same".

Co-pending U.S. Patent HMG-06-042/051, U.S. Appl. No. 11/699,875, filed Jan. 30, 2007, Assigned to the same assignee, "A Novel Magnetic Tunnel Junction (MTJ) to Reduce Spin Transfer Magnetization Switching Current".

(Continued)

*Primary Examiner*—Long Pham
(74) *Attorney, Agent, or Firm*—Saile Ackerman LLC; Stephen B. Ackerman

(57) ABSTRACT

A MTJ that minimizes error count (EC) while achieving high MR value, low magnetostriction, and a RA of about 1100 $\Omega$-$\mu m^2$ for 1 Mbit MRAM devices is disclosed. The MTJ has a composite AP1 pinned layer made of a lower amorphous $Co_{60}Fe_{20}B_{20}$ layer and an upper crystalline $Co_{75}Fe_{25}$ layer to promote a smoother and more uniform AlOx tunnel barrier. A "stronger oxidation" state is realized in the AlOx layer by depositing a thicker than normal Al layer or extending the ROX cycle time for Al oxidation and thereby reduces tunneling hot spots. The NiFe free layer has a low Fe content of about 8 to 21 atomic % and the Hf content in the NiFeHf capping layer is from 10 to 25 atomic %. A Ta hard mask is formed on the capping layer. EC (best) is reduced from >100 ppm to <10 ppm by using the preferred MTJ configuration.

8 Claims, 1 Drawing Sheet

OTHER PUBLICATIONS

"Exchange-biased magnetic tunnel junctions and application to non-volatile magnetic random access memory (invited)," by S.S. P. Parkin et al., Jrnl. of Appl. Physics, vol. 85, No. 8, Apr. 15, 1999, pp. 5828-5833.

"Progress and Outlook for MRAM Technology", by S. Tehrani et al., IEEE Trans. on Mag., vol. 35, No. 5, Sep. 1999, pp. 2814-2819.

"MgO-Based Tunnel Junction Material for High-Speed Toggle Magnetic Random Access Memory", by Renu W. Dave et al., IEEE Trans. on Mag., vol. 42, No. 8, Aug. 2006, pp. 1935-1939.

* cited by examiner

SYAF STRUCTURE TO FABRICATE MBIT MTJ MRAM

RELATED PATENT APPLICATIONS

This application is related to the following: Ser. No. 11/496,691, filing date Jul. 31, 2006; and Ser. No. 11/699,875, filing date Jan. 30, 2007, all assigned to a common assignee.

FIELD OF THE INVENTION

The invention relates to a high performance Magnetic Tunneling Junction (MTJ) element and a method for making the same, and more particularly, to a configuration comprised of a composite AP1 pinned layer, a AlOx barrier layer, and a NiFeHf capping layer that improves the TMR ratio and decreases error count in 1-Mbit MRAM devices.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. Related information on this subject is provided by S. Parkin et. al in "Exchange based magnetic tunnel junctions and application to non-volatile MRAM" J. Appl. Phys., Vol. 82, p. 5823-5833 (1999), and by S. Tehrani et. al in "Progress and Outlook for MRAM Technology", IEEE Trans. on Magn., Vol. 35, p. 2814-2819 (1999).

A MRAM device is generally comprised of an array of parallel first conductive lines on a horizontal plane, an array of parallel second conductive lines on a second horizontal plane spaced above and formed in a direction orthogonal to the first conductive lines, and an MTJ element (bit) interposed between a first conductive line and a second conductive line at each crossover location in a cross-point architecture. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the-array of first conductive lines as well as peripheral circuits used to select certain MRAM cells within the MRAM array for read or write operations.

An MTJ element may be based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode such as a first conductive line and a top electrode which is a second conductive line. An MTJ stack of layers that are subsequently patterned to yield an MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity (σHc). Alternatively, an MTJ stack may have a top spin valve configuration in which a free layer is formed on a seed layer followed by sequentially forming a tunnel barrier layer, a pinned layer, AFM layer, and a capping layer.

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("0" memory state) and a higher resistance is noted when they are in an anti-parallel state or "1" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations. The MTJ memory cells are inserted into the back end of a CMOS process. A high speed version of MRAM architecture consists of a cell with an access transistor and a plurality of MTJ (1T1MTJ) cells in the MRAM array.

A high performance MTJ element is characterized by a high magnetoresistive (MR) ratio or tunneling magnetoresistive ratio (TMR) which is dR/R where R is the minimum resistance of the MTJ element and dR is the change in resistance observed by changing the magnetic state of the free layer. A low magnetostriction ($\lambda_s$) value of about $1 \times 10^{-6}$ or less is also desirable for MRAM applications. The keys to a high performance MTJ element for MRAM are (a) well controlled magnetization of a pinned layer that has a large exchange field and high thermal stability, (b) integrity of the tunnel barrier layer and, (c) well controlled magnetization and switching of the free layer. In order to achieve good barrier properties such as a specific junction resistancexarea (RA) value and a high breakdown voltage (Vb), it is necessary to have a uniform tunnel barrier layer which is free of pinholes that is promoted by a smooth and densely packed growth in the AFM and pinned layers. Although a high RA value of about 10000 ohm-μm$^2$ is acceptable for a large area (A), RA should be relatively small (about 1000 ohm-μm$^2$) for smaller areas. Otherwise, R would be too high to match the resistance of the transistor which is connected to the MTJ.

For (a) above, the pinned layer of a MTJ element is typically made of a synthetic antiferromagnetic (SyAF) configuration such as CoFe/Ru/CoFe where Ru is a coupling layer sandwiched between a AP2 layer adjacent to an AFM layer and a AP1 layer next to the tunnel barrier. Use of a SyAF pinned layer not only improves thermal stability but also minimizes the coupling field between the pinned layer and free layer, thereby reducing the offset field. For (b), the tunnel barrier commonly used is either a thin layer of amorphous AlOx or crystalline MgO. To optimize (c) above, the free layer is best made of a thin (<50 Angstrom thick) permalloy (NiFe) film because of its reproducible and reliable switching characteristics.

Generally, the purpose of the capping layer is to protect underlying layers in the MTJ during etching and other process steps and to function as an electrical contact to an overlying conductive line. The typical capping layer for an MTJ stack is a non-magnetic conductive metal such as Ta or TaN. During thermal annealing, Ta is capable of gettering oxygen atoms originating in the adjacent NiFe free layer. Consequently, the NiFe free layer is less oxygen contaminated and a more distinct boundary between the tunnel barrier layer and NiFe free layer is thereby obtained to improve dR/R. The disadvantage of using a Ta capping layer is that Ta diffuses into NiFe during thermal annealing, especially at high annealing temperatures (i.e. >250° C.) to produce an alloy that not only reduces free layer moment (Bs) but makes NiFe very magnetostrictive with a $\lambda_s$ of $\geq 5 \times 10^{-6}$. Thus, alternative capping layer materials are desirable that minimize inter-diffusion between a free layer and capping layer, serve as a good oxygen getter material, and enable both a high MR ratio and low $\lambda_s$ value to be achieved in MTJs for advanced MRAM and TMR read head technologies.

A MRAM circuit chip typically consists of millions of MTJ bits formed on a substrate that has CMOS devices. After completing the MRAM circuits, MRAM MTJs are subjected to electrical/magnetic probing by using a quasistatic tester. One of the critical measurements obtained by the quasistatic test is error count (EC) that represents the number of defective MTJ bits. The procedure for EC measurement involves a first step of applying a 150 Oe magnetic field in the easy axis direction to re-intialize all the MTJ bits on the MRAM chip to a "0" state (i.e. free layer magnetization is parallel to pinned layer magnetization). Then, in a second step, currents are applied to the word line (WL) and bit line (BL) to switch the free layer into a "1" state (i.e. where the free layer and pinned layer magnetizations are anti-parallel). In a third step, a read operation is performed to determine how many MTJ bits in each MRAM chip failed the intended switching from "0" to "1" thereby providing an EC0 value. Similarly, an EC1 value is determined by measuring the number of MTJ bits whose free layer magnetization was first re-initialized to a "1" state, then switched to a "0" state by writing from WL and BL, and finally read to count the number of MTJ bits which failed to switch. The total EC is EC0+EC1. For a MTJ MRAM to be viable in manufacturing, a good product yield for the 1-Mbit MRAM chip is necessary which means an EC of less than 10 parts per million (ppm), and preferably less than 5 ppm. Current MTJ MRAMs have an EC on the order of 20 to 1000 ppm. Therefore, an improved MTJ configuration is needed to reduce EC to an acceptable level.

A routine search of the prior art was conducted and the following references were found. In U.S. Patent Application 2007/0015293, an oxygen surfactant layer (OSL) is formed between a composite CoFeB/CoFe AP1 pinned layer and an AlOx tunnel barrier to improve smoothness in the AlOx layer. U.S. Pat. No. 7,045,841 describes an OSL formed between an upper ferromagnetic layer made of CoFe (or CoFe/NiFe) and an AlOx tunnel barrier.

U.S. Patent Application 2007/0015294 teaches an AP1 layer made of $Co_{75}Fe_{25}$ below an AlOx tunnel barrier. According to U.S. Patent Application 2006/0017081, an interface layer made of CoFe may be formed between an amorphous fixed layer (CoFeB) and a tunnel barrier in a MTJ element.

U.S. Pat. No. 7,067,331 discloses an amorphous CoFeB fixed layer that contacts an aluminum oxide tunnel barrier. U.S. Pat. No. 6,818,458 describes a self pinned multi-layer having a CoFe alloy such as CoFeHf or CoFeZr that contacts an AlOx tunnel barrier. U.S. Patent Application 2006/0211198 discloses a Ta/Ru capping layer for the bottom conductive electrode where the Ru is etched away to form an amorphous Ta capping layer. U.S. Patent Application 2005/0276099 shows a Ru/Ta/Ru capping layer configuration for improving dR/R in a MTJ element.

SUMMARY OF THE INVENTION

One objective of the present invention is to provide a MTJ element for a 1 Mbit MRAM device that has a configuration which is capable of achieving a TMR ratio of at least 45 to 50 while maintaining an acceptable $\lambda_s$ of $<1 \times 10^{-6}$.

A second objective of the present invention is to provide a MTJ element having a RA value of about 1000 ohm-$\mu m^2$ that is suitable for 1-16 Mbit MRAM devices.

A third objective of the present invention is to provide a MTJ element according to the first two objectives that minimizes the error count (EC) in a 1 Mbit MRAM to less than about 10 ppm.

In accordance with a first embodiment, these objectives are achieved by providing a substrate on which a MRAM device is to be fabricated. A MTJ element is formed by first depositing a stack of layers on the substrate which may be comprised of a bottom conductor electrode. In one aspect, the MTJ stack has a bottom spin valve configuration in which a seed layer, AFM layer, synthetic anti-ferromagnetic (SyAF) pinned layer, tunnel barrier layer, free layer, and a capping layer are sequentially formed on the substrate. Preferably, the pinned layer has a synthetic anti-ferromagnetic (SyAF) configuration wherein a Ru coupling layer is sandwiched between a lower CoFe (AP2) layer and an upper composite AP1 layer. The composite AP1 layer has a lower amorphous CoFeB layer and an upper crystalline CoFe layer that contacts the tunnel barrier. In the exemplary embodiment, the tunnel barrier layer is comprised of amorphous AlOx. Above the tunnel barrier layer is a free layer comprised of crystalline NiFe. The capping layer on the free layer is preferably made of NiFeHf in order to minimize the thickness of the "dead" magnetic layer at the free layer/cap layer interface. In one aspect, the capping layer is further comprised of one or more layers and may have a NiFeHf/Ta/Ru or NiFeHf/Ta configuration. In a second embodiment, the NiFeHf serves as the sole material in the capping layer and a Ta hard mask is disposed on the capping layer. Note that a Ta hard mask may also be employed with the NiFeHf/Ta/Ru or NiFeHf/Ta capping layer of the first embodiment.

All of the layers in the MTJ stack are formed by sputtering or ion beam deposition (IBD). The AlOx tunnel barrier layer is typically formed by first depositing an Al layer and then oxidizing the metal by a radical oxidation (ROX) or plasma oxidation method. The AlOx tunnel barrier may be made somewhat thicker than is normally employed to minimize the tunneling hot spots. The MTJ may be annealed at a temperature in the range of about 250° C. to 300° C. Once all the layers in the MTJ stack and Ta hard mask are laid down and thermally annealed to fix the pinned layer magnetization direction, a conventional patterning and etching sequence is followed to fabricate a MTJ element with an overlying hard mask in the exemplary embodiment. Thereafter, a dielectric layer is typically deposited on the substrate adjacent to the MTJ stack and on the hard mask, and is thinned to be coplanar with the Ta hard mask. A top conductor may then be formed on the dielectric layer and Ta hard mask.

DETAILED DESCRIPTION OF THE INVENTION

The present invention is a MTJ configuration that provides a unique combination of a low RA value, high dR/R ratio, and low error count (EC) that is suitable for advanced MRAM devices such as the 1 Mbit MRAM. Although a bottom spin valve configuration is depicted in the exemplary embodiment, those skilled in the art will appreciate that the composite AP1 layer, AlOx tunnel barrier, and capping layer described herein are not limited to a specific MTJ structure and may also be employed in other configurations such as a top spin valve or multilayer spin valve. Drawings are provided by way of example and are not intended to limit the scope of the invention. Further, the drawings are not necessarily drawn to scale and the relative sizes of various elements may differ from those in an actual device.

Figure 1:
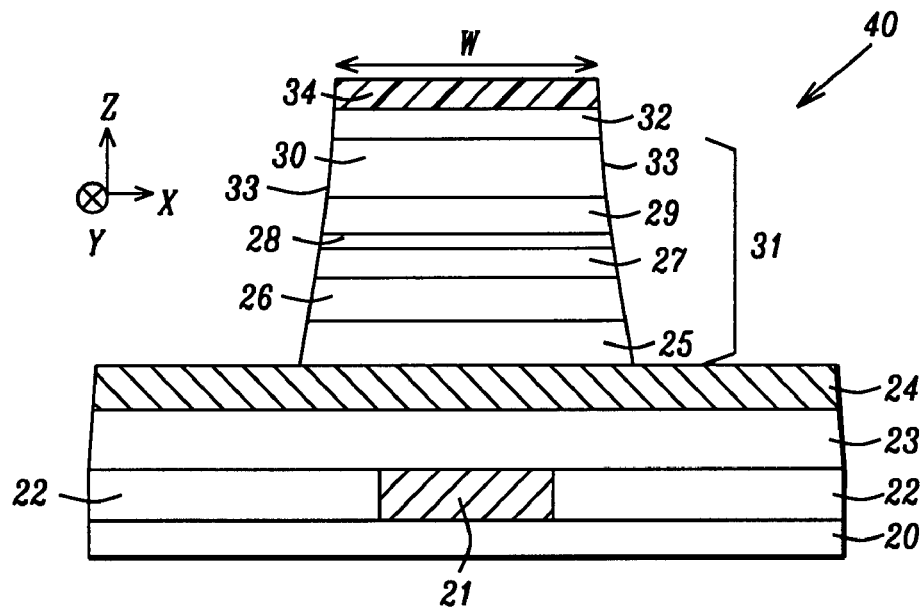
FIG. 1 is a cross-sectional view of a partially formed MRAM cell that has an MTJ element formed according to one embodiment of the present invention.

A MRAM structure formed according to a first embodiment of the present invention will now be described. Referring to FIG. 1, a partially completed MRAM structure 40 is shown that includes a substrate 20 which may be silicon or another semiconductor substrate used in the art that typically contains devices such as transistors and diodes. A first insulation layer 22 comprised of $Al_2O_3$, silicon oxide, or the like is disposed on the substrate 20. There is a first conductive line comprised of copper, for example, formed within and coplanar with the first insulation layer 22. For the purpose of this discussion, the first conductive line is a word line 21 that may be electrically connected to a transistor source electrode (not shown). Optionally, the first conductive line may be called a digit line, data line, row line, or column line as appreciated by those skilled in the art.

There is a second insulation layer 23 such as $Al_2O_3$ or silicon oxide formed on the word line 21 and first insulation layer 22. Above the second insulation layer 23 is a bottom conductor layer 24 that is interconnected to an underlying transistor (not shown) in substrate 20. The bottom conductor layer 24 may be a composite layer comprised of a lower seed layer, middle conductive layer, and upper capping layer (not shown). Futhermore, word line 21 and bottom conductor layer 24 may be connected to a source and drain of a transistor element, respectively.

It should be understood that the MRAM structure is part of an array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and-bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor layer 24 may be a sectioned line, for example, that has a rectangular shape in the x, y plane and a thickness in the z direction. Alternatively, the bottom conductor layer 24 may be a bit line that is aligned orthogonally to an underlying word line 21 and to a subsequently formed second word line above the MTJ. In one embodiment where the bottom conductor layer has a seed layer/conductive layer/capping layer configuration, the seed layer may be comprised of NiCr, Ta, or TaN. The conductive layer may be made of Ru, Rh, Ir or other metals such as Au, Cu, or α-Ta. The capping layer may be an amorphous Ta layer, for example, that serves to promote uniform and dense growth in subsequently formed MTJ layers.

A MTJ stack of layers is now formed on the bottom conductor layer 24. It should be understood that the MTJ stack may be formed in the same process tool as the bottom conductor layer. For instance, the bottom conductor layer 24 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom conductor layer 24 and overlying MTJ layers may be formed after a single pump down of the sputter system to enhance throughput.

In a preferred embodiment, the MTJ stack of layers 31 is fabricated on the bottom conductor layer 24 by sequentially forming a seed layer 25, AFM layer 26, SyAF pinned layer 27, tunnel barrier layer 28, free layer 29, and a capping layer 30. The seed layer 25 may have a thickness of about 40 to 60 Angstroms and is preferably a layer of NiCr with a thickness of 45 Angstroms and a Cr content of about 35 to 45 atomic %. However, NiFe, NiFeCr, or other suitable materials may be used as the seed layer 25 instead of NiCr. When the seed layer 25 is grown on an amorphous Ta capping layer in the bottom conductor layer 24, a smooth and dense <111> seed layer structure results that promotes smooth and densely packed growth in subsequently formed MTJ layers.

The AFM layer 26 is preferably made of MnPt with a thickness of about 100 to 200 Angstroms and more preferably 150 Angstroms although an IrMn layer having a thickness from about 50 to 100 Angstroms or a film made of NiMn, OsMn, RuMn, RhMn, PdMn, RuRhMn, or MnPtPd or the like is also acceptable. In the exemplary embodiment, the AFM layer is magnetically aligned in the y-axis direction. An external magnetic field may be applied during the deposition of an MTJ layer such as an AFM layer or a ferromagnetic (FM) layer to influence a magnetization along a certain axis.

The SyAF pinned layer 27 has an AP2/coupling layer/AP1 configuration wherein the AP1 portion is made of a lower amorphous CoFeB layer and an upper crystalline CoFe layer that contacts the tunnel barrier layer. Use of a SyAF pinned layer in the MTJ structure not only improves thermal stability but also reduces the interlayer coupling field (offset field) applied to the free layer. The AP2 layer is formed on the AFM layer 26 and is preferably comprised of CoFe with a composition of about 25 atomic % Fe and with a thickness of about 20 to 30 Angstroms and more preferably 23 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 26 along the y-axis. Exchange coupling between the AP2 layer and the AP1 layer is facilitated by a coupling layer that is preferably comprised of Ru with a thickness of about 7.5 Angstroms although Rh or Ir may be used instead of Ru.

In a first embodiment, the lower AP1 layer on the Ru coupling layer has a thickness from about 12 to 18 Angstroms, and preferably 15 Angstroms, and is comprised of amorphous CoFeB with a composition of about 40 to 60 atomic % Co, 20 to 40 atomic % Fe, and 15 to 25 atomic % B, and preferably 60 atomic % Co, 20 atomic % Fe, and 20 atomic % B. It is important that the B content be at least 15% in order to achieve an amorphous CoFeB layer. The range for Fe content mentioned above is selected as a compromise between a high Fe content to increase the MR ratio and a low Fe content to maintain a low Hc value and low magnetostriction value. The crystalline CoFe upper AP1 layer has a Fe content between 20 and 50 atomic %, and preferably 25 atomic %, and a thickness between 5 and 7 Angstroms, and preferably 6 Angstroms. Thus, in a preferred embodiment, the AP1 layer is comprised of a lower $Co_{60}Fe_{20}B_{20}$ layer and an upper $Co_{75}Fe_{25}$ layer. This composite AP1 layer composition was disclosed in patent application Ser. No. 11/699,875 which is herein incorporated by reference in its entirety.

Above the SyAF pinned layer 27 is formed a thin tunnel barrier layer 28 that is AlOx in the exemplary embodiment. Previously, the inventors have disclosed a MgO tunnel barrier formed on a CoFeB/CoFe composite AP1 layer for optimizing Spin-RAM performance in patent application Ser. No 11/699,875. A radical oxidation method for forming a MgO tunnel barrier by oxidation of a Mg layer was described by the inventors in U.S. Patent Application 2007/0015294 which is herein incorporated by reference in its entirety. A MgO layer may also be formed by a plasma oxidation of a Mg layer as described by R. Dave in "MgO-based tunnel junction material for high speed Toggle MRAM", IEEE Trans. Magn., V 42, P. 1935-39 (2006).

The inventors have previously produced a MTJ comprised of a NiCr seed layer, MnPt AFM layer, $Co_{75}Fe_{25}$/Ru/ $Co_{60}Fe_{20}B_{20}$ SyAF pinned layer, A18.25-ROX tunnel barrier, $Ni_{88}Fe_{12}$ free layer, and a $(NiFe)_{85}Hf_{15}$/Ta/Ru capping layer hereafter referred to as the process of record (POR). Use of a MnPt AFM layer and amorphous $Co_{60}Fe_{20}B_{20}$ AP1 layer was found to yield a smooth and flat bottom electrode necessary for forming a smooth tunnel barrier layer thereon. The crystalline $Co_{75}Fe_{25}$ AP2 layer through exchange bias interaction with MnPt thereby forms a robust SyAF pinned layer. Optionally, a tunnel barrier layer made of AlTiOx or the like may be used instead of AlOx but the performance of the MTJ element according to the present invention will not be as high as when an AlOx tunnel barrier is employed. Thus, the tunnel barrier layer 28 has excellent smoothness and uniformity in part because of the smooth underlying MTJ layers, and especially because of the thin crystalline CoFe upper AP1 layer. However, for advanced MRAM designs, and especially for 1-Mbit MRAMs, further optimization of the tunnel barrier and MTJ configuration is necessary to simultaneously achieve an acceptable RA value around 1000 ohm-$\mu m^2$, a dR/R of at least 45-50%, a low magnetostriction of $<1 \times 10^{-6}$, and an EC result of about 10 ppm or less.

Accordingly, the tunnel barrier 28 in the present invention is preferably an AlOx layer that is thicker than typical AlOx layers. Normally, a 7 to 8.25 Angstrom thick Al layer is deposited on the AP1 layer while fabricating a MTJ stack of layers in an MRAM device. Then a radical oxidation or plasma oxidation is performed to produce an AlOx layer. However, the inventors have advantageously found that when an Al layer about 8.5 to 9 Angstroms thick and preferably 8.75 Angstroms is deposited on the AP1 layer and then oxidized by a ROX or plasma oxidation method, the resulting AlOx tunnel barrier enables better MTJ performance by minimizing the so-called hot tunneling effect and lowering the error count (EC). The ROX or plasma oxidation process is preferably performed in an oxidation chamber within the sputter deposition system.

Optionally, a "stronger oxidation" state in the AlOx tunnel barrier may be realized by extending the ROX cycle time. Standard ROX conditions applied to previous MTJs fabricated by the inventors are comprised of a RF power of about 500 to 800 Watts and an oxygen flow rate of 0.3 to 0.6 standard liters per minute (slm), and preferably 0.6 slm for a period of about 50 to 70 seconds. However, according to the present invention, the ROX cycle time may be extended to a total time of 75 to 120 seconds. As expected, a longer ROX time (more highly oxidized) tunnel barrier leads to a higher RA. In the example where an 8.25 Angstrom thick Al layer is oxidized with a longer ROX cycle time of about 105 seconds, the RA increases to 2500 $\Omega$-$\mu m^2$ compared to a process of record (POR) of 1100 $\Omega$-$\mu m^2$ practiced by the inventors. However, the RA may be adjusted downward to near the desired 1000 $\Omega$-$\mu m^2$ by employing the composite AP1 layer described previously. Results will be discussed in a later section.

The free layer 29 formed on the tunnel barrier layer 28 is preferably made of NiFe having a composition represented by $Ni_RFe_S$ where R+S=100 and s is between about 8 and 21 atomic %, and preferably about 12 atomic % in order to reduce magnetostriction.

The free layer 29 has a thickness between 25 and 35 Angstroms, and preferably 30 Angstroms, and is magnetically aligned along the y-axis (pinned layer direction) in a "0" memory state, for example. In an embodiment where the MTJ is elliptically shaped as seen in a top view (not shown), the easy axis of the MTJ element is along the long axis (y-direction). Optionally, the free layer may be made of another material such as CoFe/NiFe having low magnetostriction.

Another important feature of the present invention is the capping layer 30 that is formed on the free layer 29. In a preferred embodiment, the capping layer 30 is a made of NiFeHf having a thickness from about 15 to 50 Angstroms, and preferably 45 Angstroms. A NiFeHf capping layer is advantageously employed by the inventors to increase the MR ratio. The required Hf content necessary to form a low magnetization NiFeHf capping layer is believed to be at least 10 atomic % while the NiFe composition is preferably the same as $Ni_RFe_S$ in the adjacent NiFe free layer 29. The upper limit for Hf content in the NiFeHf capping layer is about 25 atomic % when s=21 atomic %. In other words, when s=21 and T=25 in a capping layer composition represented by $(Ni_RFe_S)_{(100-T)}Hf_T$, the NiFeHf layer begins to exhibit non-magnetic behavior. Thus, in one embodiment, the Hf content in the NiFeHf capping layer ranges from 10 to 25 atomic %. A NiFeHf layer may be formed by co-sputtering NiFe and Hf targets according to a method disclosed in the Ser. No. 11/496,691 patent application mentioned previously. Note that a lower Hf content than 25 atomic % in the NiFeHf capping layer is needed for non-magnetic behavior when the Fe content in the NiFe sputter target is lower than 21 atomic %. For example, a Hf content of less than 25 atomic % is needed for non-magnetic behavior in a $[Ni_{82.5}Fe_{17.5}]_{1-T}Hf_T$ layer. In general, as the Hf content increases, the oxygen getter power will increase for the NiFeHf capping layer.

It is believed that the mechanism responsible for increasing the MR ratio involves gettering oxygen in the free layer 29 by the NiFeHf capping layer 30. By employing a capping layer comprised of a NiFeHf layer that contacts the adjacent free layer 29, the free layer is less oxygen contaminated and has higher conductivity, thereby improving dR/R. The oxygen gettering capability of NiFeHf is achieved because Hf has a higher oxidation potential than Ni and Fe in the adjacent free layer. Another benefit of a NiFeHf capping layer 30 is that the "dead layer" between the free layer and capping layer in the prior art is substantially reduced. The dead layer is typically a 3 to 6 Angstrom thick interface between the free layer and capping layer wherein some intermixing of layers has occurred. For example, in conventional Ru or Ta capping layers, Ru and Ta may migrate into a NiFe free layer and thereby reduce the magnetic moment of the free layer and dR/R of the MTJ. A dead layer is indicative of poor lattice matching between the free layer and adjoining capping layer. Lattice matching is optimized in the present invention where in the preferred embodiment, the free layer/capping layer configuration is $Ni_RFe_S/[(Ni_RFe_S)]_{(100-T)}Hf_T$, s is between 8 and 21 atomic %, R+S=100 atomic %, and T is from 10 to 25 atomic %. By reducing the dead layer and thereby increasing the effective volume of the free layer, the NiFeHf layer promotes a more thermally stable device since volume (V) of the free layer is directly related to the thermal stability factor $(K_uV/k_bT)$ where $K_u$ is the magnetic anisotropy energy, $k_b$ is the Boltzmann constant, and T is temperature in ° K. The present invention also encompasses other NiFeM capping layers where M is a metal such as Zr or Nb that has an oxidation potential greater than that of Ni and Fe.

In another embodiment, the capping layer may be a composite layer having a NiFeHf layer that contacts the NiFe free layer 29, and one or more other layers formed on the NiFeHf layer. In one aspect, the capping layer 30 may have a NiFeHf/Ta configuration. Optionally, the capping layer 30 may have a configuration represented by NiFeHf/Ta/Ru. In this embodiment, the thickness may vary from 10 to 50 Angstroms for the lower NiFeHf layer, 30 to 50 Angstroms for the Ta layer, and 30 to 100 Angstroms for the Ru layer. Optionally, other elements such as Zr or Nb that have a higher oxidation potential than Ni and Fe may be incorporated in a NiFeM/Ta capping layer configuration. After all of the MTJ layers have been formed, a hard mask 32 having a thickness of from 400 to 600 Angstroms, and preferably 500 Angstroms is deposited on the capping layer 30 in the same sputter deposition tool. In a preferred embodiment, a Ta hard mask 32 is formed on a NiFeHf capping layer 30. When a Ta hard mask 32 is deposited on an upper Ta layer in the capping layer 30, the upper Ta layer is typically deposited with a low Ar flow of about 20 to 50 standard cubic centimeters per minute (sccm) and the Ta hard mask is deposited with a higher Ar flow of about 50 to 100 sccm in order to minimize the stress level between the two Ta layers.

The present invention may comprise an annealing step after all of the MTJ layers have been deposited. For example, in the exemplary embodiment, the MTJ stack of layers having a CoFeB/CoFe pinned layer, an AlOx tunnel barrier layer, NiFe free layer, and NiFeHf capping layer, and the overlying hard mask layer may be annealed in a vacuum by applying a magnetic field of 10K Oe in magnitude along the y-axis (easy axis) for 1 to 5 hours at a temperature between about 250° C. to 300° C.

Next, an MTJ element 31 and overlying hard mask 32 having sidewalls 33 is fabricated by first coating and patterning a photoresist layer 34 that has a width w on the hard mask 32. Thereafter, the photoresist layer 34 is employed as an etch mask during an IBE or Reactive Ion Etch (RIE) process that removes regions of the hard mask 32 which are not protected by the etch mask. The photoresist layer 34 may be stripped after the hard mask is etched or the photoresist layer may remain on the hard mask 32 during a second RIE process that etches unprotected regions of layers 25-30 below openings in the hard mask 32. In either case, the hard mask serves as the primary etch mask during the second RIE process. As a result, an MTJ element 31 is formed that typically has sloped sidewalls 33 in which the capping layer 30 has a width in an x-axis direction that is less than the width of seed layer 25.

Figure 2:
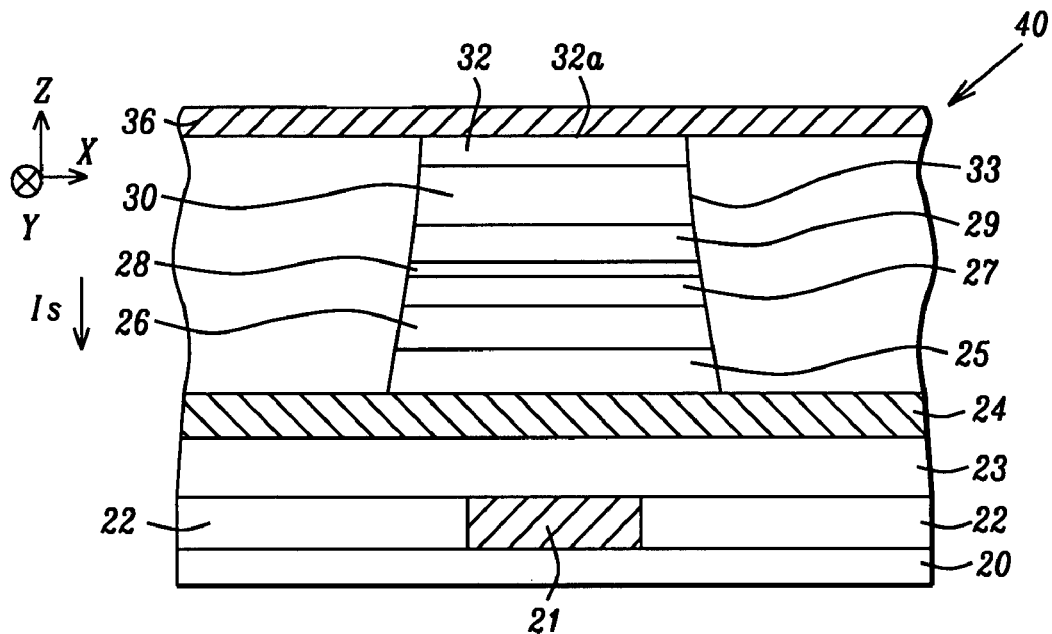
FIG. 2 is a cross-sectional view of the MRAM structure in FIG. 1 after a photoresist mask is removed and an insulation layer is formed adjacent to the MTJ element and a bit line is formed on above the MTJ element.

Referring to FIG. 2, a MRAM structure 40 is depicted after the photoresist layer 34 is removed and an insulation layer 35 is formed on the bottom electrode 24 to a thickness that covers the MTJ layers 25-30 as well as the top surface 32a of the hard mask 32. A chemical mechanical polish (CMP) process is then typically employed to planarize the insulation layer 35

(also referred to as a MTJ ILD layer) such that the insulation layer is essentially coplanar with the top surface 32a of the hard mask.

The next step in fabricating the MRAM structure 40 is to form a top conductor (bit line) 36 on the insulation layer 35 such that the bit line contacts the top surface 32a of the hard mask. The bit line 36 is typically aligned in a direction orthogonal to that of the word line 21 and may be comprised of more than one layer. For instance, a bit line made of Cu, Au, Ru, Al, or the like may be enclosed on the sides and bottom by a diffusion barrier layer, which is also an adhesion layer, as appreciated by those skilled in the art. The bit line 36 is part of a plurality of bit lines (not shown) that are formed by a conventional patterning and etching sequence that is understood by those skilled in the art. The bit lines are formed within and coplanar with a BIT ILD layer (not shown). The MTJ may be read by passing a current (Is) in a current perpendicular to plane (CPP) direction which in this case is parallel to the z-axis.

COMPARATIVE EXAMPLE 1

An experiment was conducted to compare the performance of a MTJ fabricated according to the present invention with a conventional MTJ based on a CoFeB/AlOx/NiFe AP1 pinned layer/tunnel barrier/free layer configuration. In this experiment, the MTJ stack is formed on a Ta/Ru200/α-Ta100 bottom electrode and has the following succession of layers and thicknesses in order from bottom to top: 45 Angstrom NiCr seed layer; 150 Angstrom MnPt AFM layer; $Co_{75}Fe_{25}20$/Ru7.5/AP1 SyAF pinned layer; AlOx tunnel barrier; 29 Angstrom $Ni_{88}Fe_{12}$ free layer; and a NiFeHf45/Ta30/Ru100 capping layer wherein the NiFeHf configuration is represented by $[(Ni_{88}Fe_{12})]_{85}Hf_{15}$. The AlOx tunnel barrier was prepared by depositing an 8.25 Angstrom thick Al layer and then oxidizing with a ROX process for 65 seconds with a $O_2$ flow rate of 0.6 standard liters per minute and a RF power of 800 watts. Only the AP1 layer composition is varied in order to compare a $Co_{60}Fe_{20}B_{20}$ AP1 layer from the prior art to a composite CoFeB/CoFe AP1 layer of the present invention.

After forming the MTJ stack in each example, the stacks were further processed with a 280° C., 10000 Oe annealing step for 5 hours. Magnetic performance properties of the MTJs were measured using CIPT and a B-H looper. Results are shown in Table 1.

TABLE 1

Magnetic Properties of MTJs with
$Co_{75}Fe_{25}$/Ru/AP1/AlOx(ROX)/$Ni_{88}Fe_{12}$29/NiFeHf45/Ta30/Ru100
pinned/tunnel barrier/free layer/capping layer configuration

| Row | AP1 | RA | MR | Bs | Hc | He | Hk |
|---|---|---|---|---|---|---|---|
| 1 | $Co_{60}Fe_{20}B_{20}$ 21 | 1106 | 43.3% | 0.68 | 4.88 | 2.59 | 10.83 |
| 2 | $Co_{60}Fe_{20}B_{20}$ 13/ $Co_{75}Fe_{25}$ 8 | 753 | 45.3% | 0.67 | 4.77 | 3.31 | 11.42 |

One important difference of note in Table 1 is that the RA=753 $\Omega$-$\mu m^2$ for the MTJ with a composite AP1 layer in Row 2 is much lower than the RA=1106 -$\Omega\mu m^2$ for a MTJ with a standard $Co_{60}Fe_{20}B_{20}$ AP1 layer in Row 1. Besides having a lower RA, the MTJ in Row 2 also has a higher MR. These results (lower RA, higher MR) indicate that the quality of an AlOx tunnel barrier is better when formed on a crystalline $Co_{75}Fe_{25}$ layer than on an amorphous $Co_{60}Fe_{20}B_{20}$ AP1 layer. In addition, the saturation field (Hs) for the $Co_{75}Fe_{25}20$/Ru7.5/$Co_{60}Fe_{20}B_{20}13$-$Co_{75}Fe_{25}8$ SyAF layer (row 2) is higher than that of a $Co_{75}Fe_{25}20$/Ru7.5/$Co_{60}Fe_{20}B_{20}$ 21 SyAF layer (row 1) and thereby forms a more robust SyAF pinned layer.

COMPARATIVE EXAMPLE 2

As mentioned previously, an AlOx tunnel barrier can be made into a "stronger oxidation" state or more highly oxidized state than normal by extending the ROX cycle time. As a result, an 8.25 Angstrom thick Al deposited layer may be transformed into an AlOx layer with a stronger oxidation state to give a higher MR and higher RA (2500 $\Omega$-$\mu m^2$ vs. 1100 $\Omega$-$\mu m^2$ POR) value. According to the present invention, an AP1 layer wherein a crystalline CoFe layer contacts the AlOx tunnel barrier provides a higher MR than an amorphous CoFeB AP1 layer since the former has a higher spin polarization. Alternatively, a higher RA MTJ can be produced by oxidizing a thicker Al film having an 8.5 to 9 Angstroms thickness, for example. The inventors have discovered that in both cases an improved quality tunnel barrier is formed with better film uniformity and less tunneling hot spots that result in a lower error count (EC) as indicated in Table 2. EC is understood to include shorts, opens, and magnetic defects.

According to one embodiment of the present invention, the Ru layer in a NiFeHf/Ta/Ru capping layer configuration may be omitted to give a NiFeHf/Ta capping layer. The inventors have found that by removing the Ru layer as the top layer in the MTJ stack, the RIE process that is employed to pattern the MTJ becomes cleaner with less residue on the sidewalls 33 of the patterned MTJ layer (FIG. 1). A cleaner MTJ according to the present invention causes a lower EC count. In the second example, however, the Ru layer is retained in MTJs listed in Table 2 to facilitate a CIPT measurement made on a MTJ monitor wafer. The sample MTJs shown in Table 2 represent improvements made to the 1-Mbit MTJ MRAM according to embodiments described herein including a composite AP1 layer having a crystalline CoFe top layer, a thicker or more highly oxidized AlOx layer, and a NiFeHf/Ta capping layer. Although the MTJs formed on monitor wafers in Table 2 are made with Ru as the top layer in the capping layer, the 1-Mbit MTJ MRAMs are preferably made with a NiFeHf capping layer and a Ta hard mask that is 500 to 600 Angstroms thick.

TABLE 2

Magnetic Properties of MTJs with
$Co_{75}Fe_{25}/Ru/AP1/AlOx(ROX)/Ni_{88}Fe_{12}28/NiFeHf39/Ta30/Ru100$ pinned/tunnel
barrier/free layer/capping layer configuration

| Row | AP1 | Al | ROX | RA | Lambda | MR | Bs | Hc | He | Hk |
|---|---|---|---|---|---|---|---|---|---|---|
| 1 | $Co_{60}Fe_{20}B_{20}$ 21 | 8.75 | 90 sec | 2388 | −1.15E−07 | 47.8 | 0.61 | 4.85 | 2.46 | 10.6 |
| 2 | $Co_{60}Fe_{20}B_{20}$ 15/ $Co_{75}Fe_{25}$ 6 | 8.5A | 70 sec | 1005 | 2.60E−08 | 49.0 | 0.62 | 4.92 | 2.66 | 11.0 |
| 3 | $Co_{60}Fe_{20}B_{20}$ 15/ $Co_{75}Fe_{25}$ 6 | 9A | 105 s | 2512 | −2.57E−08 | 50.0 | 0.61 | 4.74 | 3.20 | 11.1 |

The MTJ in row 2 of Table 2 is fabricated with a $Co_{60}Fe_{20}B_{20}/Co_{75}Fe_{25}$AP1 layer and thicker AlOx (from an 8.5 Angstrom thick Al layer vs. 8.25 Angstroms in Table 1) to provide an RA of 1005 Ω-μm². The other layers in the MTJ are the same as those in Comparative Example 1. Note that the ROX cycle time is increased from 65 sec. in Table 1 to 70-105 sec. in Table 2. Besides having a higher TMR (MR=49.0%) than the POR MTJ (RA~1100 Ω-μm², MR=45%) described previously, the MTJ in row 2 has a lower RA and a free layer that is non-magnetostrictive (very low lambda). Thus, the MTJ (row 2) should have a higher device speed than the POR with a lower MR and higher RA. Furthermore, in a quasistatic test known to those skilled in the art, the MTJ of the present invention that has a $Co_{75}Fe_{25}$(crystalline/AlOx/NiFe(crystalline) configuration displays a more symmetrical MR/bias voltage characteristic than the POR which has a CoFeB (amorphous)/AlOx/NiFe(crystalline) configuration.

COMPARATIVE EXAMPLE 3

In a third set of experiments, the error count (EC) for a plurality of samples was determined in order to assess MTJ performance for 1-Mbit MRAM applications. Table 3 is a summary of results including EC where EC(best) is the error count for the best chip in the 86 chips (across the wafer) tested while EC(mean) is the mean value for EC for the MTJ MRAM wafer. MTJs in rows 1 and 2 represent POR samples that are made with a CoFe/Ru/CoFeB SyAF pinned layer, NiFe(17.5-21%) free layer, Ru/Ta/Ru100 capping layer, and a Ta500 hard mask. The AlOx tunnel barrier is made with an A18.25/ROX 65-70 second process to give a RA of about 950 Ω-μm². TMR is ~40% and V50 (bias voltage at which TMR is reduced to half is about 650 mV. In rows 1 and 2, the EC for the best chip is≧50.

TABLE 3

Magnetic Properties of MTJs with BE/NiCr45/MnPt150/
$Co_{75}Fe_{25}20/Ru7.5/AP1/AlOx(ROX)/NiFe$ free layer/capping layer configuration

| Row | AP1 | AlOx | Free layer | Capping layer | RA | MR | Rp | Rp-cov | V50 (mV) | EC best | EC mean |
|---|---|---|---|---|---|---|---|---|---|---|---|
| 1 | CoFeB21 | Al8.25/ ROX 70" | NiFe(21%)27 | Ru30/Ta30/ Ru | 950 | 41 | 13K | 1.5% | 650 | >100 | 500-1000 |
| 2 | CoFeB21 | Al8.25/ ROX 70" | NiFe(17.5)38 | Ru30/Ta30/ Ru | 950 | 37 | 13K | 1.5% | 650 | 50 | 65-100 |
| 3 | CoFeB21 | Al8.25/ ROX 70" | NiFe(21%)10/ NiFe(12%)23 | NiFeHf25/ Ta/Ru | 1100 | 45 | 14K | 1.2% | 750 | 22 | 50-100 |
| 4 | CoFeB21 | Al8.25/ ROX 70" | NiFe(12%)27 | NiFeHf45/ Ta/Ru | 1100 | 47 | 14K | 1.2% | 750 | 10 | 20-50 |
| 5 | CoFeB21 | Al8.75/ ROX 90" | NiFe(12%)28 | NiFeHf40/ Ta50 | 2200 | 47 | 25K | 1.3% | 750 | 6 | 18 |
| 6 | CoFeB15/ CoFe6 | Al8.5/ ROX 75 | NiFe(12%)28 | NiFeHf40/ Ta50 | 1100 | 47 | 14K | 1.2% | 750 | 1 | 7 |
| 7 | CoFeB15/ CoFe6 | Al9.0/ ROX 100 | NiFe(12%)28 | NiFeHf40/ Ta50 | 2500 | 50 | 25K | 1.3% | 750 | 0 | 6 |

In rows 3-4, the MTJ is fabricated with a $Ni_{88}Fe_{12}$ free layer and a $(Ni_{88}Fe_{12})_{85}Hf_{15}$/Ta/Ru capping layer according to one embodiment of the present invention. Above the Ru layer is a 500 Angstrom thick Ta hard mask. By employing a new capping layer, the RA is increased to around 1100 Ω-μm² and results in a Rp ($R_{MTJ}+R_{TX}$) of 14K ohm. At the same time, TMR is improved to >45% and $V_{50}$ increases to 750 mV. It should be understood that during a read operation, the MTJ is 300 mV biased thereby reducing TMR to about 25-28% for the examples in rows 3-4 compared to TMR=20% for a biased MTJ having an old capping layer with a Ru/Ta/Ru configuration. Furthermore, the MTJs in rows 3-4 have been found to deliver a 30% higher signal output vs. MTJs in rows 1-2 which is another advantage of the present invention. The error count (EC) for MTJs with a NiFeHf/Ta/Ru capping layer is also substantially reduced to a range of 10-22 compared to 50-100 for the old Ru/Ta/Ru capping layer.

In row 5 of Table 3, the MTJ combines two features of the present invention which are a thicker AlOx tunnel barrier and a capping layer made of $(Ni_{88}Fe_{12})_{85}Hf_{15}$/Ta which yields a higher RA of 2200 Ω-μm². As mentioned previously, removal of Ru from the capping layer enables a cleaner RIE process during MTJ patterning which in turn results in a further reduction in EC value.

The most significant impact on EC reduction is realized in a preferred embodiment of the present invention that combines a composite $Co_{60}Fe_{20}B_{20}/Co_{75}Fe_{25}$ AP1 layer, a thicker (more highly oxidized) AlOx tunnel barrier, and a $(Ni_{88}Fe_{12})_{85}Hf_{15}$/Ta capping layer in a MTJ which is represented in rows 6-7. Note that in an actual MRAM device, a hard mask about 500 to 600 Angstroms thick and preferably made of Ta is disposed above the NiFeHf/Ta capping layer. The properties of the MTJ in row 6 not only satisfy the performance requirements for Hc, RA, MR, and $\lambda_s$, but also provide the lowest EC observed to date with a value well below the desired 10 ppm level. In addition, EC(mean) is less than 10 ppm which indicates the EC improvement can be reproduced across the wafer. Thus, the novel MTJs described herein enable higher quality 1-Mbit MRAM devices because of a unique combination of a low EC and higher performance in terms of Hc, MR, RA, and magnetostriction values.

As mentioned previously, the present invention also anticipates an embodiment in which the capping layer is comprised only of NiFeHf and the hard mask is made of Ta. Although the magnetic properties of a MTJ with this configuration have not been measured yet, the inventors expect the results to be very similar to those listed in rows 6 and 7 of Table 3. In other words, changing the capping layer/hard mask configuration from (NiFeHf/Ta50)/Ta500 to NiFeHf/Ta500 should not have a significant effect on the magnetic properties of the MTJ.

While this invention has been particularly shown and described with reference to, the preferred embodiment thereof, it will be understood by those skilled in the art that various changes in form and details may be made without departing from the spirit and scope of this invention.

We claim:

1. A MTJ element for a magnetic memory device, comprising:
    a pinned layer having an AP2/coupling layer/AP1 configuration wherein the AP2 layer is formed on an AFM layer and the AP1 layer is a composite having a lower amorphous CoFeB layer and an upper crystalline CoFe layer;
    an AlOx tunnel barrier formed on the crystalline CoFe layer;
    a free layer with low magnetostriction and low Hc formed on the AlOx tunnel barrier;
    and a capping layer formed on the free layer wherein the capping layer is comprised of NiFeM where M is a metal having an oxidation potential greater than that of Ni and Fe.

2. The MTJ element of claim 1 wherein the amorphous CoFeB AP1 pinned layer has a composition represented by $Co_xFe_yB_z$ where x+y+z=100, x is from about 40 to 60 atomic %, y is from about 20 to 40 atomic %, and z is from about 15 to 25 atomic %, and the upper crystalline CoFe layer has a composition represented by $Co_vFe_w$ where v+w=100 and w is about 20 to 50 atomic %.

3. The MTJ element of claim 1 wherein the free layer is comprised of $Ni_RFe_S$ where r+s=100 and s is from about 8 to 21 atomic %.

4. The MTJ element of claim 3 wherein M=Hf and the NiFeHf layer has a composition represented by $(Ni_RFe_S)_{100-T}Hf_T$ where T is about 10 to 25 atomic %.

5. The MTJ element of claim 4 wherein the capping layer is further comprised of a Ta layer formed on the NiFeHf layer.

6. The MTJ element of claim 5 wherein the capping layer is further comprised of a Ru layer formed on the Ta layer to give a NiFeHf/Ta/Ru capping layer configuration.

7. The MTJ element of claim 1 wherein a Ta hard mask about 400 to 600 Angstroms thick is formed on the capping layer.

8. The MTJ element of claim 1 wherein the magnetic memory device is a 1 Mbit MRAM and the MTJ is further comprised of a seed layer formed on a substrate and an AFM layer formed on the seed layer, said AFM layer contacts the AP2 layer in the pinned layer.

* * * * *